US011897516B2

(12) United States Patent
Cho

(10) Patent No.: US 11,897,516 B2
(45) Date of Patent: Feb. 13, 2024

(54) APPARATUS AND METHOD FOR SIMULATION OF AUTONOMOUS VEHICLE

(71) Applicants: Hyundai Motor Company, Seoul (KR); Kia Corporation, Seoul (KR)

(72) Inventor: Hong Cho, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 171 days.

(21) Appl. No.: 17/518,425

(22) Filed: Nov. 3, 2021

(65) Prior Publication Data

US 2022/0194429 A1 Jun. 23, 2022

(30) Foreign Application Priority Data

Dec. 17, 2020 (KR) .......................... 10-2020-0177747

(51) Int. Cl.
  *B60W 60/00* (2020.01)
(52) U.S. Cl.
  CPC . *B60W 60/0027* (2020.02); *B60W 2554/4041* (2020.02); *B60W 2554/4042* (2020.02); *B60W 2554/4043* (2020.02); *B60W 2554/4045* (2020.02); *B60W 2554/801* (2020.02); *B60W 2554/802* (2020.02); *B60W 2554/803* (2020.02); *B60W 2554/804* (2020.02)
(58) Field of Classification Search
  CPC ... B60W 60/0027; B60W 60/00; G05B 13/04; G05D 1/0212
  See application file for complete search history.

(56) References Cited

U.S. PATENT DOCUMENTS

| 10,501,091 B2* | 12/2019 | Kislovskiy | ........ B60W 50/0205 |
| 10,599,155 B1* | 3/2020 | Konrardy | .............. B60W 10/04 |
| 2016/0314224 A1* | 10/2016 | Wei | ........................ G06F 30/20 |
| 2019/0146492 A1* | 5/2019 | Phillips | ................ G05B 13/041 |
| | | | 701/23 |
| 2019/0354105 A1* | 11/2019 | Cunningham | ........ G05D 1/0246 |
| 2020/0097004 A1* | 3/2020 | Whittaker | ............. B60W 40/04 |
| 2020/0130709 A1* | 4/2020 | Rodionova | .......... G05B 13/042 |
| 2021/0072744 A1* | 3/2021 | Urano | .................. G05D 1/0011 |
| 2021/0094540 A1* | 4/2021 | Bagschik | ............ G06F 11/3013 |

(Continued)

OTHER PUBLICATIONS

El Sallab et al, "Deep Reenforcement Learning Framework for Autonomous Driving", Apr. 2017, arXiv (Year: 2017).*

(Continued)

*Primary Examiner* — Hussein Elchanti
*Assistant Examiner* — Kenneth M Dunne
(74) *Attorney, Agent, or Firm* — Fox Rothschild LLP

(57) ABSTRACT

A method for simulation of an autonomous vehicle includes preparing a setting of a parameter and an initial value configured to determine a driving condition of the autonomous vehicle and a driving condition of an event to be performed by a surrounding vehicle to implement a simulation environment of the autonomous vehicle. The method further includes performing a normal driving in which the surrounding vehicle travels at a speed and a position that match a predetermined condition set in the parameter to perform the event given, and performing an event driving in which the surrounding vehicle performs the event given based on a setting value of the parameter.

16 Claims, 10 Drawing Sheets

(56) References Cited

U.S. PATENT DOCUMENTS

2022/0169244 A1* 6/2022 Sun ................. B60W 60/00276
2022/0185323 A1* 6/2022 Dolben .............. B60W 60/0011

OTHER PUBLICATIONS

Ulbrich et al, "Defining and Substantiating the Terms Scene, Situation, and Scenario for Automated Driving", 2015, IEEE (Year: 2015).*
Najm et al, "Pre-Crash Scenario Typology for Crash Avoidance Research", 2007, NHTSA, pp. 28-64 (Year: 2007).*
Wood et al, "Safety First for Automated Driving", 2019, various automotive and techology companies, pp. 85-89 (Year: 2019).*

* cited by examiner

FIG. 6

| LN(ego,init) | 4 | | |
|---|---|---|---|
| t, n | 1 | 2 | 3 |
| M(safety,n) | M(safety,ref)*1 | M(safety,ref)*2 | M(safety,ref)*3 |
| E(Vrel,n) | 15.1 | 8.5 | 5.0 |
| E(type,n) | 1 (DECELERATION) | 3 (LANE CHANGE, LEFT) | 4 (LANE CHANGE, RIGHT) |
| E(risk,n) | 1.5 | 2.0 | 1.7 |
| E(a,n) | 2.21 | 3.5 | 1.2 |
| E(LC,n) | 3.5 | 4.5 | 3.2 |
| E(end,n) | WAIT | WAIT | WAIT |

APPARATUS AND METHOD FOR SIMULATION OF AUTONOMOUS VEHICLE

CROSS-REFERENCE TO RELATED APPLICATION(S)

This application is based on and claims priority under 35 U.S.C. § 119 to Korean Patent Application No. 10-2020-0177747, filed on Dec. 17, 2020, the disclosure of which is incorporated herein by reference in its entirety.

TECHNICAL FIELD

The present disclosure relates to an autonomous vehicle, and more particularly to an apparatus and a method for simulating an autonomous driving function of the autonomous vehicle.

BACKGROUND

An autonomous vehicle is a vehicle having an autonomous driving function that autonomously controls a vehicle's behavior by identifying and determining surrounding conditions. To achieve a high level of autonomous driving function, an autonomous vehicle needs to safely control its behavior by realizing surrounding environments under various conditions in research and development stages, and by detecting and determining the surrounding environments well.

In a conventional simulation of an autonomous vehicle, only one event (simulation form) was performed in one simulation. In particular, in a one-to-one relationship between an autonomous vehicle and a surrounding vehicle, a single event was performed based on only a relative distance and a relative speed. Therefore, a simulation time is prolonged, and the results obtained through the simulation is not satisfied.

SUMMARY

The present disclosure provides an apparatus and a method for simulation of an autonomous vehicle capable of implementing a surrounding environment required for simulation using a plurality of surrounding vehicles, performing a continuous event by the plurality of surrounding vehicles, and determining whether an event is performed in consideration of the road environment, and the like.

Additional aspects of the disclosure will be set forth in part in the description which follows and, in part, will be obvious from the description, or may be learned by practice of the disclosure.

In accordance with an aspect of the present disclosure, a method for simulation of an autonomous vehicle may include preparing a setting of a parameter and an initial value to determine a driving condition of the autonomous vehicle and a driving condition of an event to be performed by a surrounding vehicle to implement a simulation environment of the autonomous vehicle; performing a normal driving in which the surrounding vehicle travels at a speed and a position that match a predetermined condition set in the parameter to perform the event given; and performing an event driving in which the surrounding vehicle performs the event given based on a setting value of the parameter.

The preparation step may further include calculating a distance related to an event of the surrounding vehicle based on precise map data, and calculating the number of surrounding vehicles based on user input data. The setting of the parameter and the initial value may include setting a starting driving lane of the autonomous vehicle; a starting relative position between the autonomous vehicle and the surrounding vehicle; and a condition for the event to be performed by the surrounding vehicle.

The setting of the condition for the event to be performed by the surrounding vehicle may include at least one of a safe distance between the autonomous vehicle and the surrounding vehicle; a relative speed of the surrounding vehicle relative to the autonomous vehicle; a type of the event; a degree of risk of the event; an acceleration of the surrounding vehicle when the event is performed; and a lane change time of the surrounding vehicle when the event is performed.

The normal driving may include a follow mode in which the surrounding vehicle travels along the autonomous vehicle. The surrounding vehicle performing the follow mode may be a surrounding vehicle in an event waiting state before performing the event given. The plurality of surrounding vehicles may perform events in a predetermined order when multiple surrounding vehicles are present. The order of preforming the given event of the plurality of surrounding vehicles may be determined according to a type and a degree of risk of the given event of each of the plurality of surrounding vehicles. The method may further include generating a plurality of events in response to a plurality of different degrees of risk by changing the degree of risk to a plurality of different values.

In accordance with another aspect of the present disclosure, an apparatus for simulation of autonomous vehicle may include a communicator configured to communicate with a simulation apparatus, the autonomous vehicle, and a surrounding vehicle; and a controller configured to prepare a setting of a parameter and an initial value configured to determine a driving condition of the autonomous vehicle and a driving condition of an event to be performed by a surrounding vehicle to implement a simulation environment of the autonomous vehicle, perform a normal driving in which the surrounding vehicle travels at a speed and a position that match a predetermined condition set in the parameter to perform the event given, and perform an event driving in which the surrounding vehicle performs the event given based on a setting value of the parameter.

The controller may be configured to calculate a distance related to an event of the surrounding vehicle based on precise map data, and calculate the number of surrounding vehicles based on user input data when preparing the setting. The setting of the parameter and the initial value may include a starting driving lane of the autonomous vehicle; a starting relative position between the autonomous vehicle and the surrounding vehicle; and a condition for the event to be performed by the surrounding vehicle.

The setting of the condition for the event to be performed by the surrounding vehicle includes at least one of a safe distance between the autonomous vehicle and the surrounding vehicle; a relative speed of the surrounding vehicle relative to the autonomous vehicle; a type of the event; a degree of risk of the event; an acceleration of the surrounding vehicle when the event is performed; and a lane change time of the surrounding vehicle when the event is performed.

The normal driving may include a follow mode in which the surrounding vehicle travels along the autonomous vehicle. The surrounding vehicle performing the follow mode may be a surrounding vehicle in an event waiting state before performing the event given. The plurality of surrounding vehicles may perform events in a predetermined order when the surrounding vehicle is a plural.

The order of preforming the given event of the plurality of surrounding vehicles may be determined according to a type and a degree of risk of the given event of each of the plurality of surrounding vehicles. The controller may further include generating a plurality of events in response to a plurality of different degrees of risk by changing the degree of risk to a plurality of different values.

In accordance with another aspect of the present disclosure, a method for simulation of an autonomous vehicle may include preparing a setting of a parameter and an initial value configured to determine a driving condition of the autonomous vehicle and a driving condition of an event to be performed by a surrounding vehicle to implement a simulation environment of the autonomous vehicle; performing a normal driving in which the surrounding vehicle travels at a speed and a position that match a predetermined condition set in the parameter to perform the event given; and performing an event driving in which the surrounding vehicle performs the event given based on a setting value of the parameter; wherein when a plurality of surrounding vehicles are present, an order of preforming the given event in the plurality of surrounding vehicles may be determined by a type and a degree of risk of the given event, and a plurality of events corresponding to a plurality of different degrees of risk may be generated by changing the degree of risk to a plurality of different values.

In accordance with another aspect of the present disclosure, an apparatus for simulation of an autonomous vehicle may include a communicator configured to communicate with a simulation apparatus, the autonomous vehicle, and a surrounding vehicle; and a controller configured to prepare a setting of a parameter and an initial value configured to determine a driving condition of the autonomous vehicle and a driving condition of an event to be performed by a surrounding vehicle to implement a simulation environment of the autonomous vehicle, perform a normal driving in which the surrounding vehicle travels at a speed and a position that match a predetermined condition set in the parameter to perform the event given, and perform an event driving in which the surrounding vehicle performs the event given based on a setting value of the parameter; wherein when a plurality of surrounding vehicles are present, an order of preforming the given event in the plurality of surrounding vehicles may be determined by a type and a degree of risk of the given event, and a plurality of events corresponding to a plurality of different degrees of risk may be generated by changing the degree of risk to a plurality of different values.

BRIEF DESCRIPTION OF THE DRAWINGS

These and/or other aspects of the disclosure will become apparent and more readily appreciated from the following description of the exemplary embodiments, taken in conjunction with the accompanying drawings, of which:

FIG. 6 is a view showing an example of the parameter generation result shown in FIG. 5 in a table;

DETAILED DESCRIPTION

Figure 1:
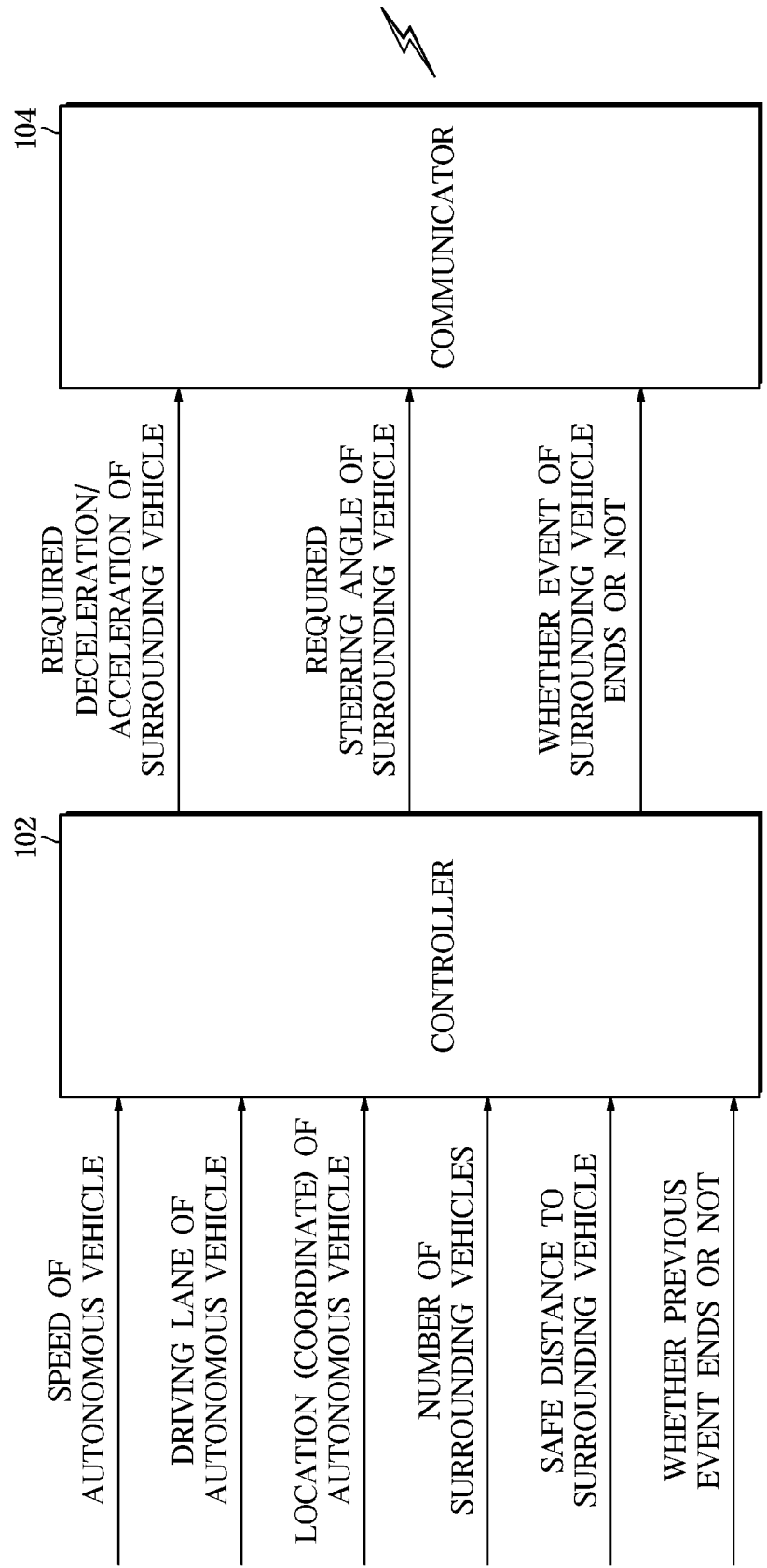
FIG. 1 is a view showing a simulation apparatus for an autonomous vehicle according to an embodiment.

The present disclosure relates to an apparatus and a method for performing a simulation of an autonomous vehicle by assuming a specific situation of a predetermined condition in the course of researching and developing an autonomous driving function of the autonomous vehicle. In particular, the present disclosure, in order to perform a simulation of the autonomous vehicle, may include generating continuously specific situations to be implemented by surrounding vehicles according to road conditions.

In the following description, an 'autonomous vehicle' is a test vehicle for testing an autonomous driving function. In addition, a 'surrounding vehicle' is a vehicle prepared to create a specific situation in the vicinity of the autonomous vehicle for testing of the autonomous vehicle. An 'event' refers that the surrounding vehicle travels in a predetermined form for simulation (test) of the autonomous driving function of the autonomous vehicle. The event may include, for example, a deceleration and an acceleration, a lane change, and the like. The autonomous vehicle performs autonomous driving in consideration of road conditions and events of surrounding vehicles.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

FIG. 1 is a view showing a simulation apparatus for an autonomous vehicle according to an embodiment. As shown in FIG. 1, the simulation apparatus for the autonomous vehicle according to an embodiment of the present disclosure may include a controller 102 and a communicator 104. As shown in FIG. 1, the controller 102 of the simulation apparatus may be configured to receive a variety of information required for performing a simulation, and generate and output various control signals to operate surrounding vehicles (see 262, 264, and 266 of FIG. 2) based on the received a variety of information.

The controller 102 may be a processor of a simulation apparatus provided separately, or an electronic control unit (ECU) of an autonomous vehicle 200 which will be described in FIG. 2, or a processor additionally installed in the autonomous vehicle 200. Information input to the controller 102 may include a speed of autonomous vehicle, a driving lane of autonomous vehicle, a location (coordinate) of autonomous vehicle, the number of surrounding vehicles, a safe distance to surrounding vehicle, and whether previous event ends or not.

Control signals generated and output by the controller 102 may include a required deceleration/acceleration of surrounding vehicle, a required steering angle of surrounding vehicle, and whether event of surrounding vehicle ends or not. Such information and control signals may be transmitted via communication between the controller 102 of the simulation apparatus, the autonomous vehicle (test vehicle) 200, and the surrounding vehicles 262, 264, and 266. The communicator 104 may be used for communication between the controller 102 and the autonomous vehicle (test vehicle) 200 and the surrounding vehicles 262, 264, and 266. In addition, the communicator 104 may also be configured to receive some of information input to the controller 102. In other words, the communicator 104 may be configured to receive some of the information input to the controller 102 and transmit the received information to the controller 102.

Figure 2:
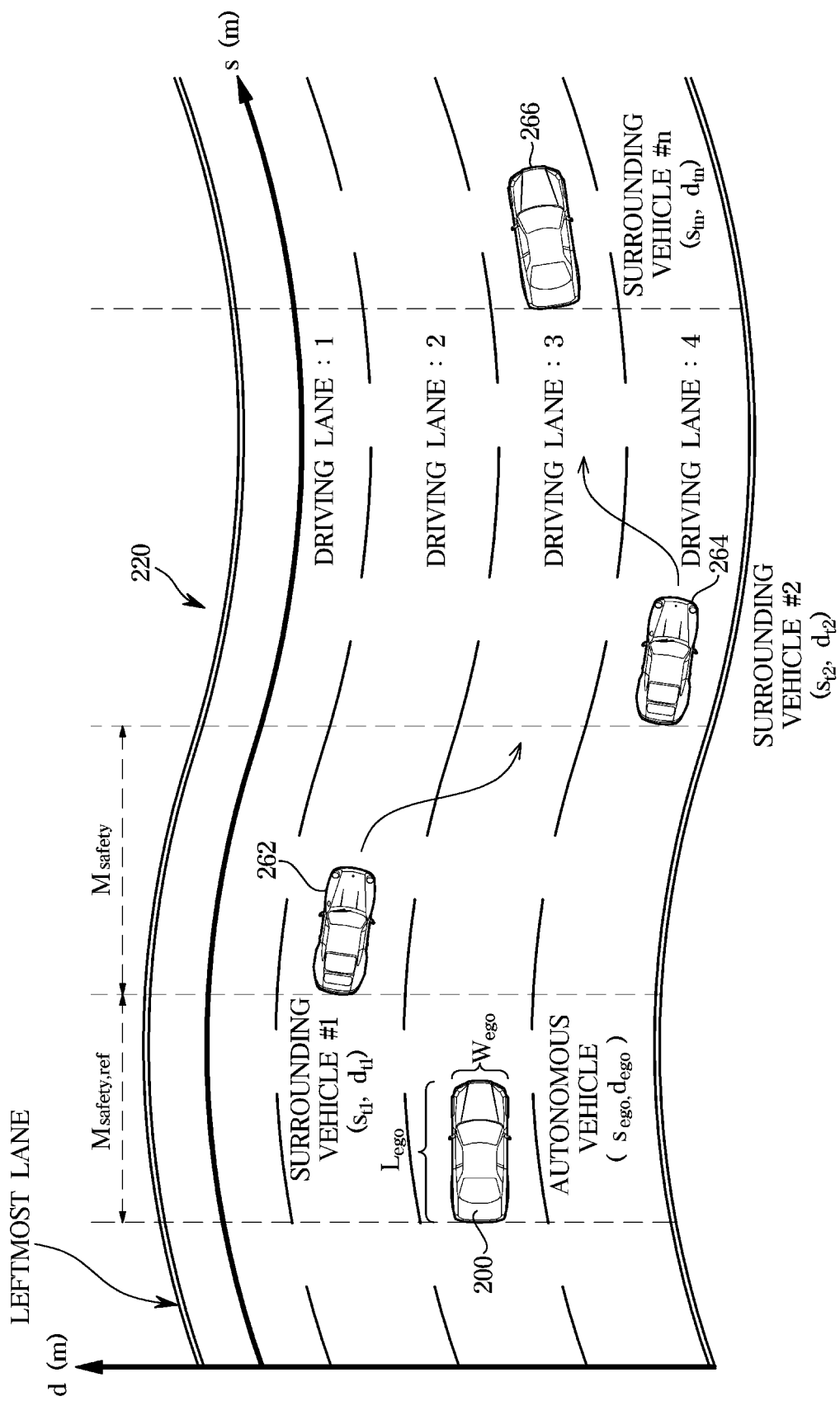
FIG. 2 is a view illustrating an example of a simulation environment of the autonomous vehicle according to an embodiment.

FIG. 2 is a view illustrating an example of a simulation environment of the autonomous vehicle according to an embodiment. As shown in FIG. 2, the autonomous vehicle 200 is simulated while the autonomous vehicle 200 and the surrounding vehicles 262, 264, and 266 are traveling on a road 220.

The terms and parameters used in the simulation environment of the autonomous vehicle 200 according to the embodiment of the present disclosure as shown in FIG. 2 may be defined as follows. S-d coordinate system: In the simulation as shown in FIG. 2, a position and a movement distance are indicated through the s-d coordinate system. The S-d coordinate system is a coordinate system of a movement distance (s) in a traveling direction (a longitudinal direction)—a lateral distance (d) based on the leftmost lane of the vehicle's traveling direction on a precise map used for simulation. The origin of the s-axis of the s-d coordinate system is a starting point of traveling for the simulation.

s(max): Total length of a section to be simulated of a road (m)

n: Vehicle number of surrounding vehicle

T(num): Number of surrounding vehicles s(ego): Distance traveled by autonomous vehicle on the road (m)

d(ego): Lateral distance in s-d coordinate system of autonomous vehicle (m)

s(t, n): Movement distance of surrounding vehicle #n (m)

d(t, n): Lateral distance from a reference lane of surrounding vehicle #n (m)

V(ego): Speed of autonomous vehicle (km/h)

V(ego, test): Set speed for testing of autonomous vehicle (km/h)

a(ego, test): Set acceleration for testing of autonomous vehicle (m/s^2)

V(t, n): Speed of surrounding vehicle #n (km/h)

a(t, n): Acceleration of surrounding vehicle #n (km/h)

V(diff): Threshold of speed difference between autonomous vehicle and surrounding vehicle (km/h)

LN(max): Total number of driving lanes on the road

LN(ego, init): Lane number of a starting driving lane of autonomous vehicle

LN(ego): Lane number of a current driving lane of autonomous vehicle

LN(t, n): Lane number of a current driving lane of surrounding vehicle #n

M(safety, ref): Reference event preparation distance of surrounding vehicle (m)

M(safety, n): Relative event preparation distance of surrounding vehicle #n (m)

K(safety): Event preparation distance coefficient of surrounding vehicle (m)

G(safety): Event preparation weights of surrounding vehicle

E(end, n): Whether event of surrounding vehicle #n ends (wait, proceed, end)

E(end, n−1): Whether event of surrounding vehicle #n−1 ends (wait, proceed, end)

E(type, n): Event type of surrounding vehicle #n (deceleration, acceleration, lane change (left), lane change (right))

E(risk, ego): Degree of risk between autonomous vehicle and surrounding vehicle #n E(risk, n): Event risk setting value of surrounding vehicle #n (real number)

E(risk, start): Event risk setting range of surrounding vehicle: Start

E(risk, end): Event risk setting range of surrounding vehicle: End

E(Vrel, n): Event relative speed setting value of surrounding vehicle #n (real number) (km/h)

E(Vrel, start): Event relative speed setting range of surrounding vehicle: Start (km/h)

E(Vrel, end): Event relative speed setting range of surrounding vehicle: End (km/h)

E(a, n): Event required acceleration setting value of surrounding vehicle #n (real number) (m/s^2)

E(a, start): Event required acceleration setting range of surrounding vehicle: Start (m/s^2)

E(a, end): Event required acceleration setting range of surrounding vehicle: End (m/s^2)

E(LC, n): Lane change time of surrounding vehicle #n (real number) (s)

E(LC, start): Event lane change time setting range of surrounding vehicle: Start (s)

E(LC, end): Event lane change time setting range of surrounding vehicle: End (s)

L(ego): Length of autonomous vehicle (m)

W(ego): Width of autonomous vehicle (m)

Figure 3:
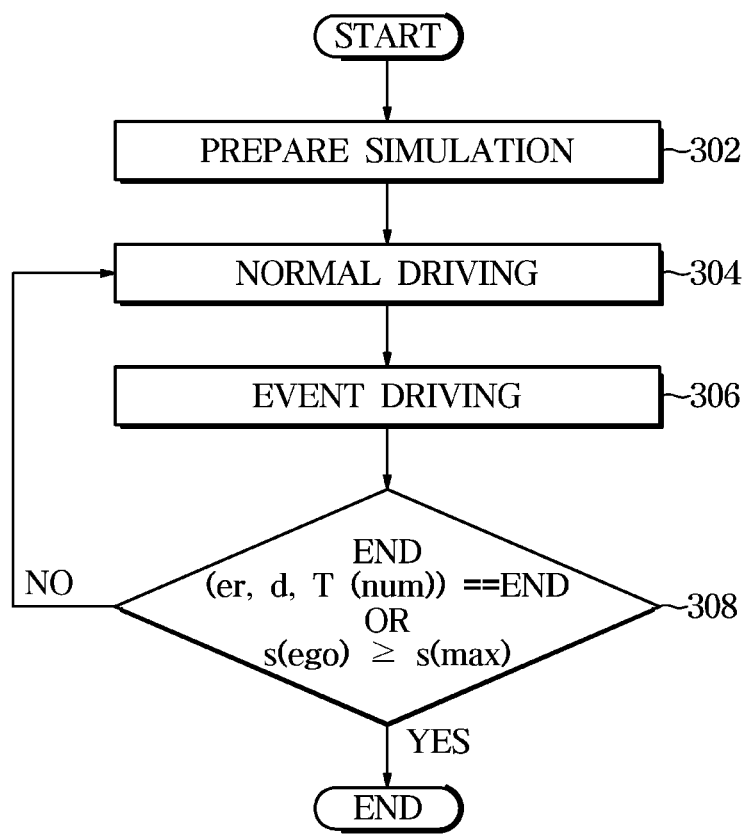
FIG. 3 is a view showing a simulation of the autonomous vehicle according to an embodiment.

FIG. 3 is a view showing a simulation of the autonomous vehicle according to an embodiment. As shown in FIG. 3, the simulation of the autonomous vehicle according to the embodiment of the present disclosure may include a simulation preparation, a normal driving, and an event driving.

In the simulation preparation 302, parameters required for the surrounding vehicles 262, 264, and 266 to perform an event in the simulation are generated and initial values of each parameter are predetermined. The parameter setting will be described in more detail with reference to FIGS. 5 and 6 to be described later. In the normal driving 304, a driving speed and a position of the surrounding vehicles 262, 264, and 266 may be adjusted to match driving conditions set in advance in preparation for performing an event before the surrounding vehicles 262, 264, and 266 perform the event. In the event driving 306, an event given to the surrounding vehicles 262, 264, and 266 may be performed by the surrounding vehicles 262, 264, and 266 based on the parameters generated in the simulation preparation 302.

Conditions for ending the simulation are as shown in 308 of FIG. 3. In other words, the simulation ends when all events of all surrounding vehicles 262, 264, and 266 are terminated, or when a total distance traveled by the autonomous vehicle 200 is greater than or equal to a total length of the road on which the simulation is to be performed (E(end, Tnum)==end or s(ego)≥s(max)).

Figure 4:
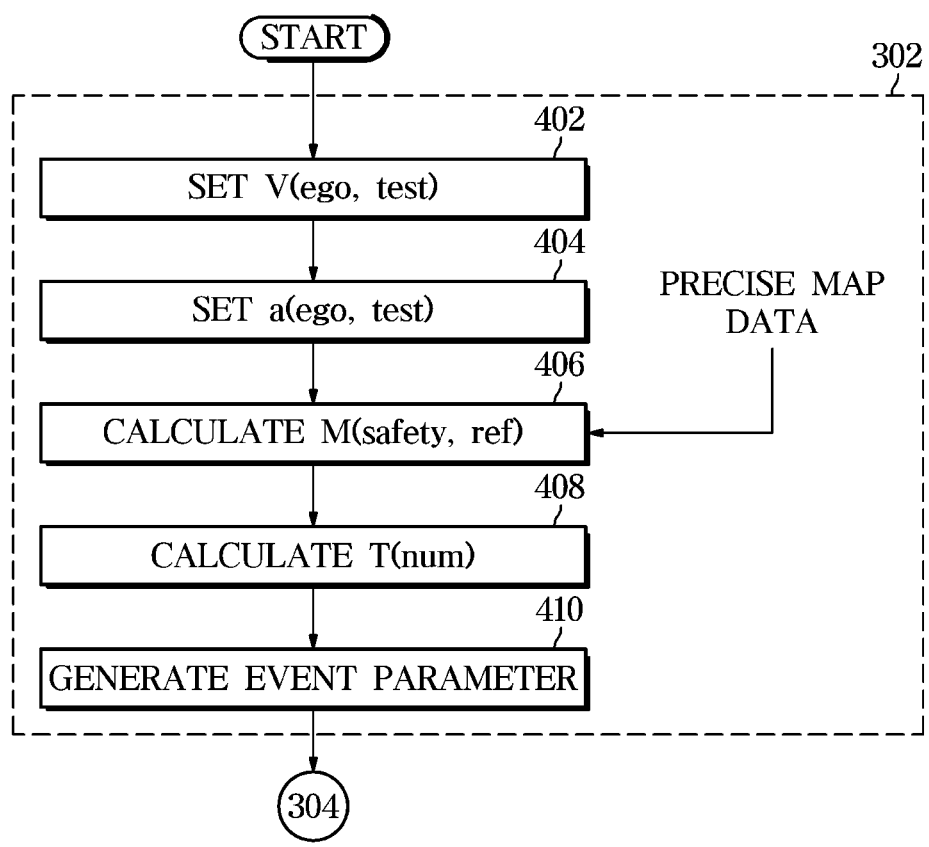
FIG. 4 is a view showing a simulation preparation of the simulation of the autonomous vehicle shown in FIG. 3.

FIG. 4 is a view showing a simulation preparation of the simulation of the autonomous vehicle shown in FIG. 3. As shown in FIG. 4, the controller 102 of the simulation apparatus may be configured to first set a test speed of the autonomous vehicle 200 V(ego, test) (402). The test speed of the autonomous vehicle 200 V(ego, test) may be predetermined as a target speed for the performance of the simulation of the autonomous vehicle 200. The test speed of the autonomous vehicle 200 V(ego, test) may be input by a user through a user interface of the simulation apparatus.

Furthermore, the controller 102 of the simulation apparatus may be configured to set a test acceleration of the autonomous vehicle 200 a(ego, test) (404). The test acceleration of the autonomous vehicle 200 a(ego, test) may be predetermined as a target acceleration for the performance of the simulation of the autonomous vehicle 200. The test acceleration of the autonomous vehicle 200 a(ego, test) may be input by the user through the user interface of the simulation apparatus.

Additionally, the controller 102 of the simulation apparatus may be configured to calculate a reference event preparation distance of the surrounding vehicles 262, 264, and 266 M(safety, ref) (406). The reference event preparation distance of the surrounding vehicles 262, 264, and 266 M(safety, ref) is, as shown in FIG. 2 described above, may be a distance secured for safety between the autonomous vehicle 200 and the closest surrounding vehicle #1 (262). The calculation of the reference event preparation distance of the surrounding vehicles 262, 264, and 266 M(safety, ref) may be performed with reference to precise map data. The reference event preparation distance of the surrounding vehicles 262, 264, and 266 M(safety, ref) may be calculated through Equation 1 below. In Equation 1, V(ego, test) is the test speed of the autonomous vehicle, a(ego, test) is the test acceleration of the autonomous vehicle, and K(safety) is an event preparation distance coefficient of the surrounding vehicle.

$$M_{safety, ref} = \frac{V_{ego,test}}{2 * a_{ego,test}} + K_{safety} \qquad \text{Equation 1}$$

Furthermore, the controller 102 of the simulation apparatus may be configured to calculate the number of the surrounding vehicles 262, 264, and 266 T(num) (408). In FIG. 2, the number of surrounding vehicles 262, 264, and 266 is 3. The number of the surrounding vehicles 262, 264, and 266 T(num) may be calculated through Equation 2 below. In Equation 2, s(max) is the total length of the section to be simulated of the road, and M(safety, ref) is the reference event preparation distance of the surrounding vehicles 262, 264, and 266.

$$T_{num} = \text{QUOTIENT OF } \frac{S_{max}}{M_{safety,ref}} \qquad \text{Equation 2}$$

Furthermore, the controller 102 of the simulation apparatus may be configured to generate parameters that determine conditions of an event to be performed by the surrounding vehicles 262, 264, and 266 (410). While the simulation is in progress, the surrounding vehicles 262, 264, and 266 perform events such as the deceleration, the acceleration, and the lane change according to the parameters generated by the controller 102.

Figure 5:
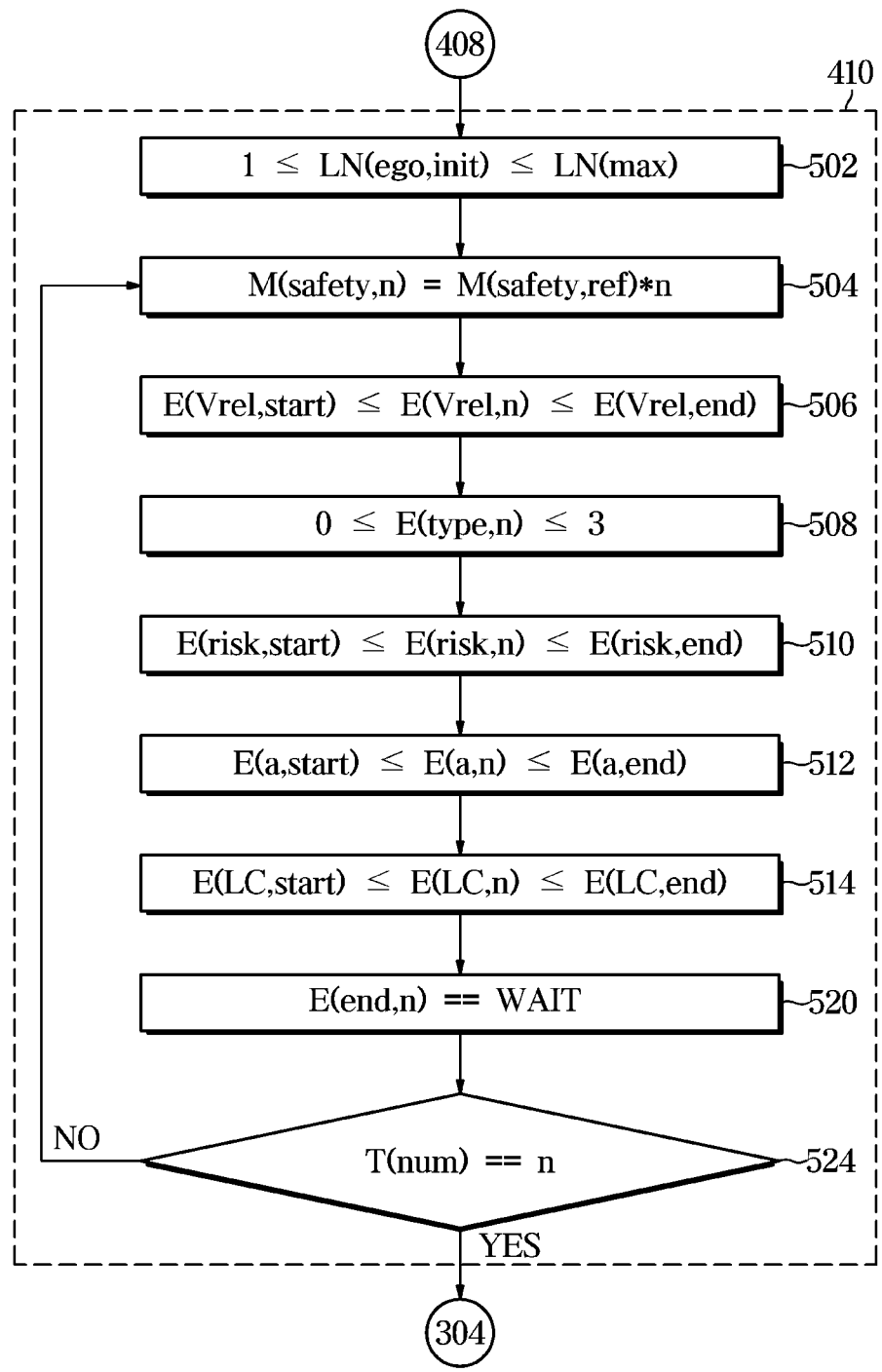
FIG. 5 is a view showing a parameter generation in the simulation preparation process shown in FIG. 4.

FIG. 5 is a view showing a parameter generation in the simulation preparation process shown in FIG. 4. As shown in FIG. 5, in 502 of FIG. 5, a parameter corresponding to a lane number of a starting driving lane of the autonomous vehicle 200 LN(ego, init) is set to a number obtained by generating a random number in a range that is greater than or equal to 1 but less than or equal to a total number of driving lanes on the road LN(max) (1≤LN(ego, init)≤LN(max)).

In 504 of FIG. 5, a parameter corresponding to the relative event preparation distance of the surrounding vehicle #n M(safety, n) is set to M(safety, ref)*n, which is an n multiple of the reference event preparation distance of the surrounding vehicle #1 (262) (M(safety, n)=M(safety, ref)*n). In 506 of FIG. 5, a parameter corresponding to the event relative speed setting value of the surrounding vehicle #n E(Vrel, n) may be set to a number obtained by generating a random number in a range that is greater than or equal to the event relative speed setting range of the surrounding vehicles 262, 264, and 266 E(Vrel, start) but less than or equal to the event relative speed setting range of the surrounding vehicles 262, 264, and 266 E(Vrel, end) (E(Vrel, start)≤E(Vrel, n)≤E(Vrel, end))

In 508 of FIG. 5, the event type of the surrounding vehicle #n E(type, n) may be determined (0≤E(type, n)≤3). The event determined at this time may include, for example, the deceleration 0 and the acceleration 1, the lane change (left) 2, and the lane change (right) 3. If 2 is selected as the event, the lane change (left) may be determined as the event. In 510 of FIG. 5, a parameter corresponding to the event risk setting value of the surrounding vehicle #n E(risk, n) may be set to a number obtained by generating a random number in a range that is greater than or equal to the event risk setting range of the surrounding vehicles 262, 264 and 266 (start) E(risk, start) but less than or equal to the event risk setting range of the surrounding vehicles 262, 264 and 266 (end) E(risk, end) (E(risk, start)≤E(risk, n)≤E(risk, end)).

In 512 of FIG. 5, a parameter corresponding to the event required acceleration setting value of the surrounding vehicle #n E(a, n) may be set to a number obtained by generating a random number in a range that is greater than or equal to the event required acceleration setting range of the surrounding vehicles 262, 264, and 266 (start) E(a, start) but less than or equal to the event required acceleration setting range of the surrounding vehicles 262, 264, and 266 (end) E(a, end), (E(a, start)≤E(a, n)≤E(a, end)). In 514 of FIG. 5, a parameter corresponding to the lane change time of the surrounding vehicle #n E(LC, n) may be set to a number obtained by generating a random number in a range that is greater than or equal to the event lane change time setting range of the surrounding vehicles 262, 264, and 266 (start) E(LC, start) but less than or equal to the event lane change time setting range of the surrounding vehicles 262, 264, and 266 (end) E(LC, end) (E(LC, start)≤E(LC, n)≤E (LC, end)).

When a setting of the event types and the parameters of the surrounding vehicle #n is completed, whether the event of the surrounding vehicle #n ends or not is set to 'wait' (520), and the above-described processes may be repeated for all surrounding vehicles 262, 264, and 266 (524). The parameters generated in the simulation preparation process are not limited thereto shown in FIG. 5, and the number and types of parameters may be changed according to characteristics of the type of event to be performed in the simulation.

FIG. 6 is a view showing an example of the parameter generation result shown in FIG. 5 in a table. As shown in FIG. 6, the lane number of the starting driving lane of the autonomous vehicle 200 LN(ego, init) is 4. In other words, in a stage of starting the simulation, the autonomous vehicle 200 starts driving in a driving lane 4. Each of the surrounding vehicles #n is numbered 1, 2, and 3.

The relative event preparation distance of each surrounding vehicle #n M(safety, n) may be set to be 1 times (*1), 2 times (*2), and 3 times (*3) of the reference event preparation distance of the surrounding vehicle M(safety, ref). The events set for each of the surrounding vehicles #n E(type, n) are 1 (deceleration), 3 (lane change, left), and 4 (lane change, right). The event risk setting values for each of the surrounding vehicles #n E(risk, n) are 1.5, 2.0, and 1.7. The event required acceleration setting values for each of the surrounding vehicles #n E(a, n) are 2.21, 3.5, and 1.2. The lane change times for each of the surrounding vehicles #n E(LC, n) are 3.5, 4.5, and 3.2.

Whether the event of each of the surrounding vehicles #n ends E(end, n) is 'wait'. This is because a current stage is a parameter setting stage and the events of each of the surrounding vehicles 262, 264, and 266 are not performed. Depending on whether the event is performed, whether the event ends may be changed from 'wait' to 'proceed' or 'end'.

Figure 7:
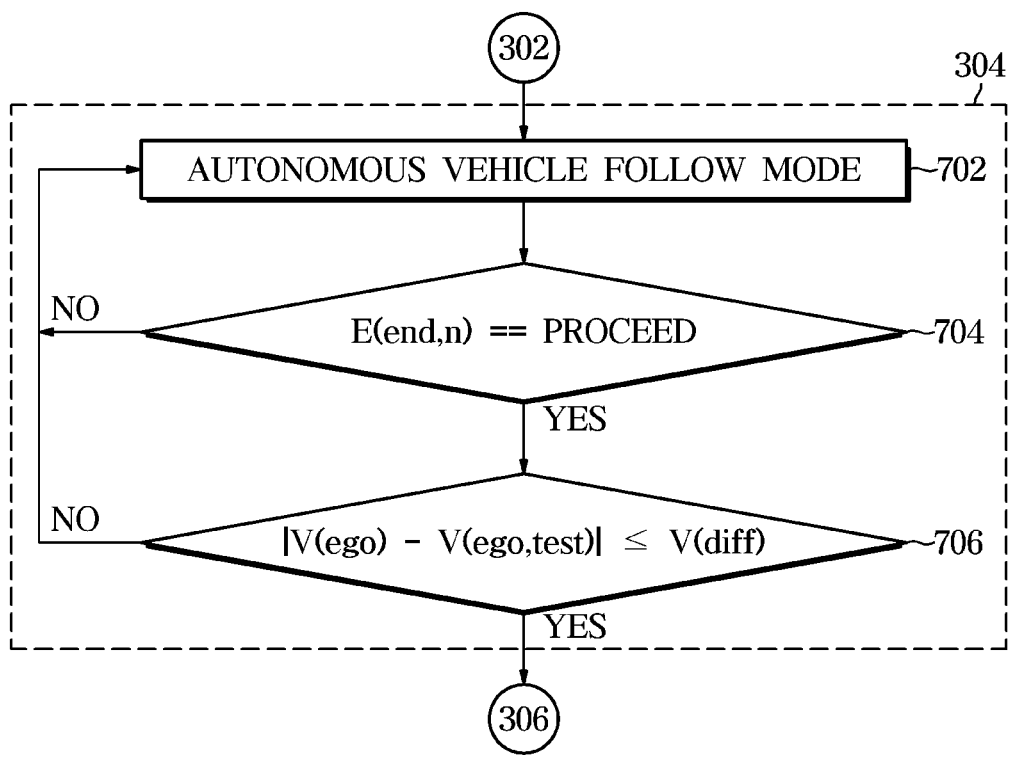
FIG. 7 is a view showing a normal driving of the simulation of the autonomous vehicle shown in FIG. 3.

FIG. 7 is a view showing a normal driving of the simulation of the autonomous vehicle shown in FIG. 3. As shown in FIG. 7, in the normal driving 304 of the simulation, the surrounding vehicles 262, 264, and 266 travel in a follow mode that basically follows the autonomous vehicle 200 (702). In other words, the surrounding vehicles 262, 264, and 266, in which whether event of the surrounding vehicle #n ends E(end, n) is not 'proceed', travel in the follow mode following the autonomous vehicle 200 (No in 704).

If whether event of the surrounding vehicle #n ends E(end, n) is 'proceed' (YES in 704) and when an absolute value of the difference between the speed of the autonomous vehicle 200 V(ego) and the test speed of the autonomous vehicle 200 V(ego, test) is less than or equal to a value of the threshold of the speed difference between the autonomous vehicle 200 and the surrounding vehicles 262, 264, and 266 V(diff) (YES in 706), the event driving in 306 is performed.

Figure 8:
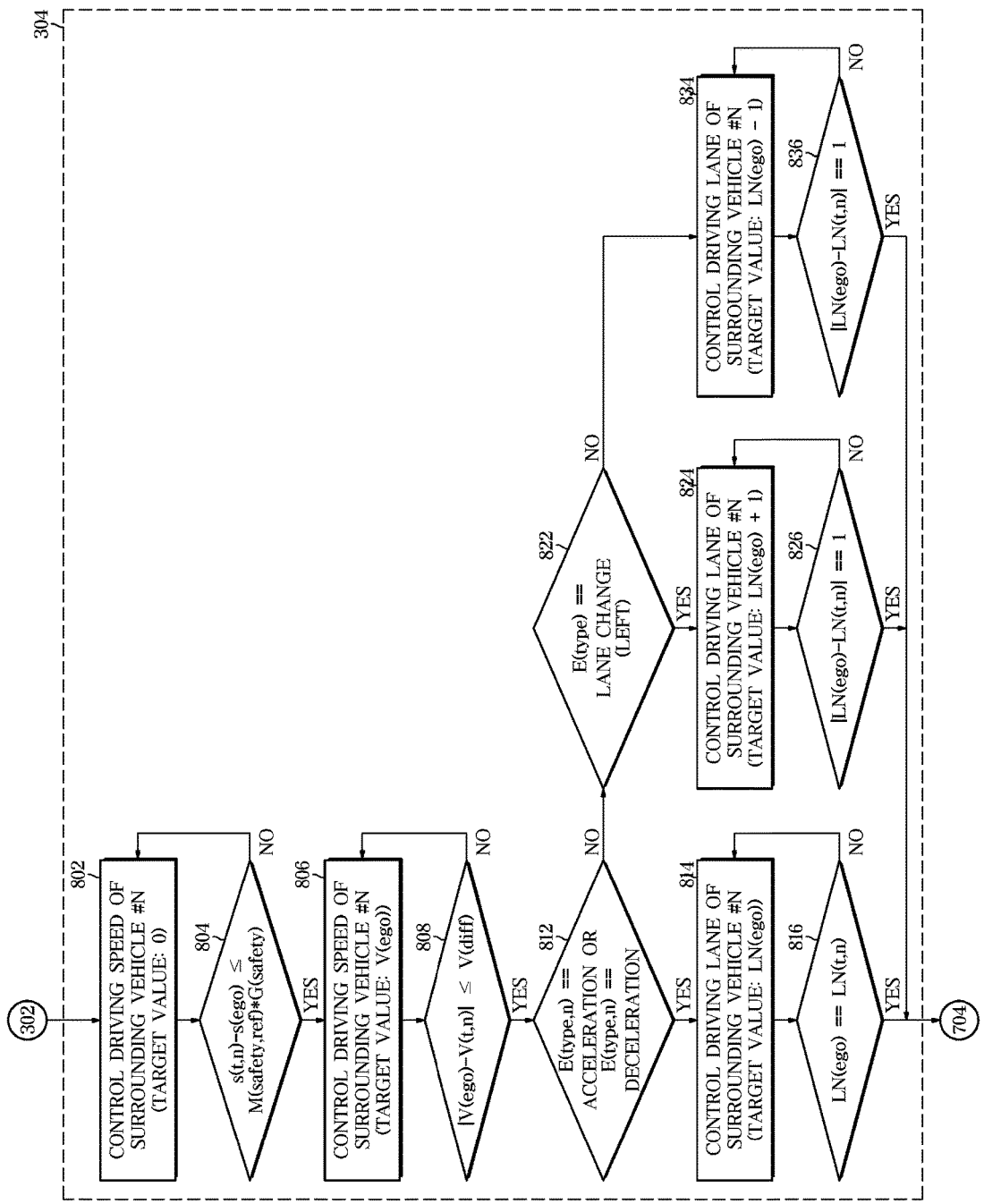
FIG. 8 is a view showing an autonomous vehicle follow mode shown in FIG. 7.

FIG. 8 is a view showing a follow mode of the autonomous vehicle shown in FIG. 7. As shown in FIG. 8, in the follow mode of the autonomous vehicle, the surrounding vehicle #n travels at the same speed as the autonomous vehicle 200 in order to prevent an interference with other event situations. In addition, based on the types of event, the positions of the lane of the autonomous vehicle 200 and the lane of the surrounding vehicle #n may be adjusted.

First, the driving speed of the surrounding vehicle #n may be adjusted (802). At this time, the target speed of the surrounding vehicle #n is 0 (stop). In response to determining that the difference between the movement distance of the surrounding vehicle #n s(t, n) and the movement distance of the autonomous vehicle 200 s(ego) is less than or equal to a value obtained by multiplying the reference event preparation distance of the surrounding vehicle #n M(safety, ref) by the event preparation weights of the surrounding vehicle #n G(safety) (S(t, n)−s(ego)≤M(safety, ref)*G(safety)) (YES in 804), the driving speed of the surrounding vehicle #n may be adjusted to be equal to the speed of the autonomous vehicle 200 (806).

In response to determining that an absolute value of the difference between the speed of the autonomous vehicle 200 V(ego) and the speed of the surrounding vehicle #n V(t, n) is less than or equal to a value of the threshold of the speed difference between the autonomous vehicle 200 V(diff) and the surrounding vehicles 262, 264, and 266 (|V(ego)−V (t, n)|≤V(diff)) (YES in 808), whether the event type of the surrounding vehicle #n E(type, n) is the acceleration or the deceleration may be identified (812). If the event type of the surrounding vehicle #n E(type, n) is the acceleration or the deceleration (YES in 812), the driving lane of the surrounding vehicle #n may be adjusted to be change to match the driving lane of the autonomous vehicle 200 (814).

Next, in response to determining that the surrounding vehicle #n travels in the same lane as the autonomous vehicle 200 (LN(ego) LN(t, n)) (YES in 816), operation 704 in FIG. 7 proceeds. In other words, in operations 812 to 816 of FIG. 8, the surrounding vehicle #n moves in the same lane as the driving lane of the autonomous vehicle 200 to perform an event such as the acceleration or the deceleration in front or behind the autonomous vehicle 200.

In 812 described above, in response to determining that the event type of the surrounding vehicle #n E(type, n) is not the acceleration or the deceleration (NO in 812), whether the event type of the surrounding vehicle #n E(type, n) is the lane change (left) may be identified (822). Herein, the lane change (left) refers to changing from a current lane to a left lane. In response to determining that the event type of the surrounding vehicle #n E(type, n) is the lane change (left) (YES in 822), the driving lane of the surrounding vehicle #n may be changed to a right side lane of a current driving lane of the autonomous vehicle 200 (LN(ego)+1) (824).

In response to determining that the driving lane of the surrounding vehicle #n is changed to the right side lane of the autonomous vehicle 200 (LN(ego)+1) (|LN(ego)−LN(t, n)|==1) (YES in 826), operation 704 of FIG. 7 proceeds. In other words, in operations 822 to 826 of FIG. 8, the surrounding vehicle #n moves to the right side lane of the lane in which the autonomous vehicle 200 is traveling to perform a lane change event from the right lane to the left lane of the autonomous vehicle 200. In 812 described above, in response to determining that the event type of the surrounding vehicle #n E(type, n) is not the lane change (left) (No in 822), the driving lane of the surrounding vehicle #n may be changed to a left side lane of the current driving lane of the autonomous vehicle 200 (LN(ego)−1) (834).

In response to determining that the driving lane of the surrounding vehicle #n is changed to the right side lane of the autonomous vehicle 200 (LN(ego)−1) (|LN(ego)−LN(t, n)|==1) (YES in 836), operation 704 of FIG. 7 proceeds. In other words, in operations 834 to 836 of FIG. 8, the surrounding vehicle #n moves to the left lane of the lane in which the autonomous vehicle 200 is traveling to perform the lane change event from the left lane to the right lane of the autonomous vehicle 200.

Figure 9:
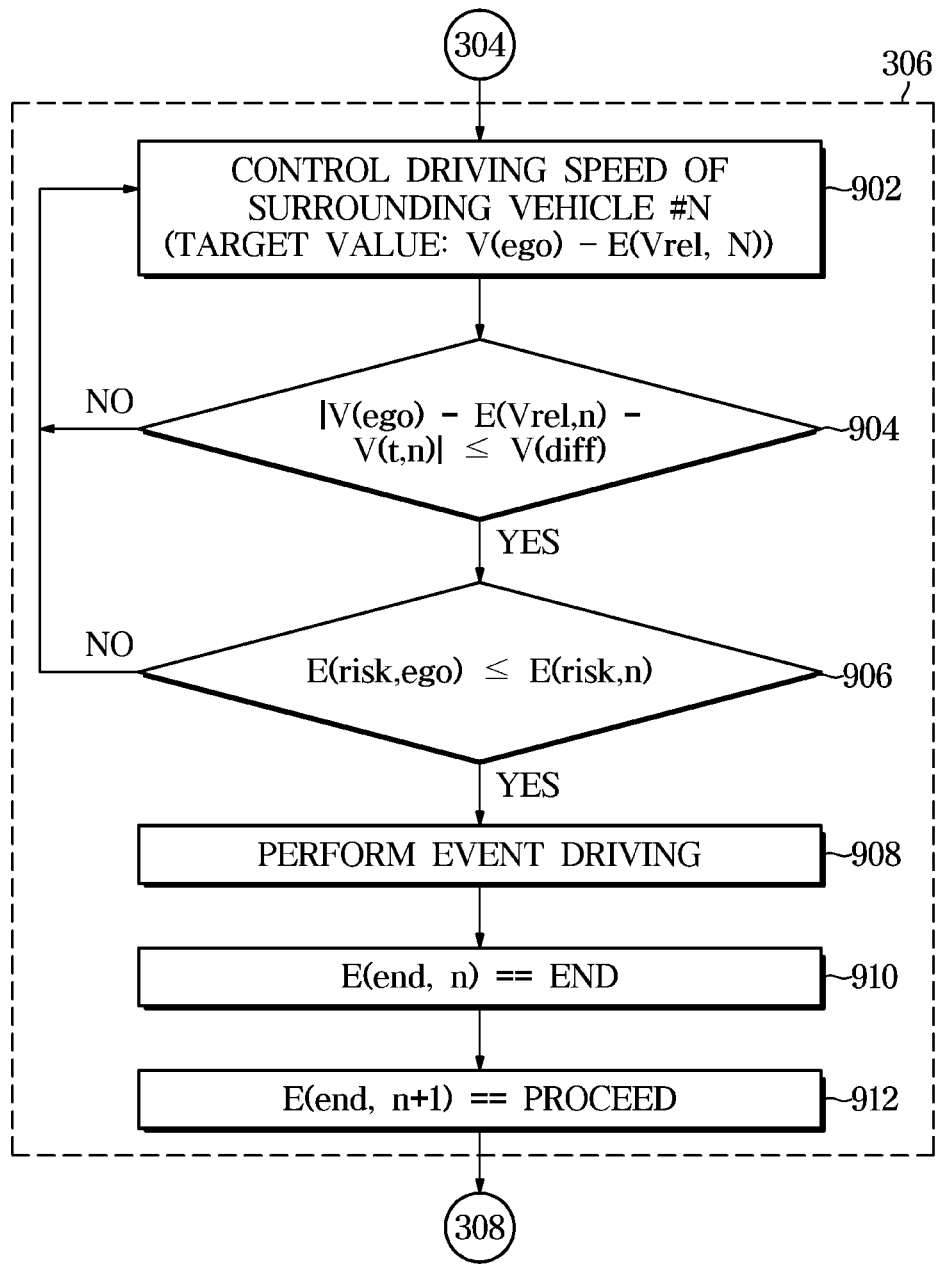
FIG. 9 is a view showing an event driving execution in the simulation of the autonomous vehicle shown in FIG. 3.

FIG. 9 is a view showing an event driving execution in the simulation of the autonomous vehicle shown in FIG. 3. As shown in FIG. 9, the driving speed of the surrounding vehicle #n is set. In particular, a target driving speed is the difference between the speed of the autonomous vehicle 200 V(ego) and the event relative speed setting value of the surrounding vehicle #n E(Vrel, n) (V(ego)−E(Vrel, n)) (902). In this state, it may be identified whether an absolute value of the differences between the speed of the autonomous vehicle 200 V(ego), the event relative speed setting value of the surrounding vehicle #n E(Vrel, n), and the speed of the surrounding vehicle #n V(t, n) decreases below the threshold of the speed difference between the autonomous vehicle 200 and the surrounding vehicle #n V(diff) (|V(ego)−E(Vrel, n)−V(t, n)|≤V(diff)) (904).

In addition, in response to determining that the condition of 904 is satisfied (YES in 904), whether the degree of risk between the autonomous vehicle 200 and the surrounding vehicle #n E(risk, ego) is less than or equal to the event risk setting value of the surrounding vehicle #n E(risk, n) may be identified (E(risk, ego)≤E(risk, n)) (906). The event risk setting value E(risk, n) is a value generated for each of the surrounding vehicles 262, 264, and 266 through the event parameter generation 410 of FIG. 4 described above. In the event driving, when the degree of risk between the autonomous vehicle 200 and the surrounding vehicle #n E(risk, ego) is less than the event risk setting value of the surrounding vehicle #n E(risk, n), the surrounding vehicle #n performs an event given.

E(risk, ego) and E(risk, n) are risk indices of the autonomous vehicle 200 and surrounding vehicles 262, 264, and 266, respectively, and the smaller the value, the higher the degree of risk (e.g., risk of collision). Accordingly, various risk situations may be simulated by variously changing the risk index in the event parameter generation (410 in FIG. 4). In particular, through the change of the risk index, various events may be freely created regardless of a shape of a road (straight or curved), speed of the autonomous vehicle 200, speed of the surrounding vehicles 262, 264, and 266, a relative distance, and the like.

In the exemplary embodiment of the parameter in FIG. 6 described above, when E(risk, n)=2, whether to perform the event based on a relative risk criterion with E(risk, ego) may be determined. For example, because E(risk, ego) calculated through current driving states of the autonomous vehicle 200 and the surrounding vehicle #n is 1.5, and E(risk, 2) of a set parameter is 2.0 (E(risk, ego)<E(risk, 2)), the surrounding vehicle #2 performs the event given.

The degree of risk E(risk, ego) may be calculated using Equation 3 below. In Equation 3, s(ego) is the distance traveled by the autonomous vehicle 200 on the road, L(ego) is the length of the autonomous vehicle 200, s(t, n) is the movement distance of the surrounding vehicle #n, V(ego) is the speed of the autonomous vehicle 200, V(t, n) is the speed of the surrounding vehicle #n, and E(risk, end) is the event risk setting range of the surrounding vehicle #n (end).

$$E_{risk,ego} = \begin{cases} \dfrac{s_{ego} + L_{ego} - s_{t,n}}{V_{ego} - V_{t,n}} & (V_{ego} - V_{t,n} > 0) \\ E_{risk,end} & (V_{ego} - V_{t,n} \leq 0) \end{cases} \quad \text{Equation 3}$$

In addition, in response to determining that the condition of 906 is satisfied (YES in 906), the surrounding vehicle #n may perform the event driving to perform the event given to the surrounding vehicle #n (908). The event given to the surrounding vehicle #n may be any one of the deceleration, the acceleration, the lane change (left), and the lane change (right).

When the event given to the surrounding vehicle #n ends, E(end, n) indicating whether the event of the surrounding vehicle #n ends is changed to 'end' (910). Next, whether an event E(end,n+1) of a next surrounding vehicle #n+1 ends may be changed to 'proceed' (912). Accordingly, the event given to the surrounding vehicle #n+1 proceeds in a next step.

Figure 10:
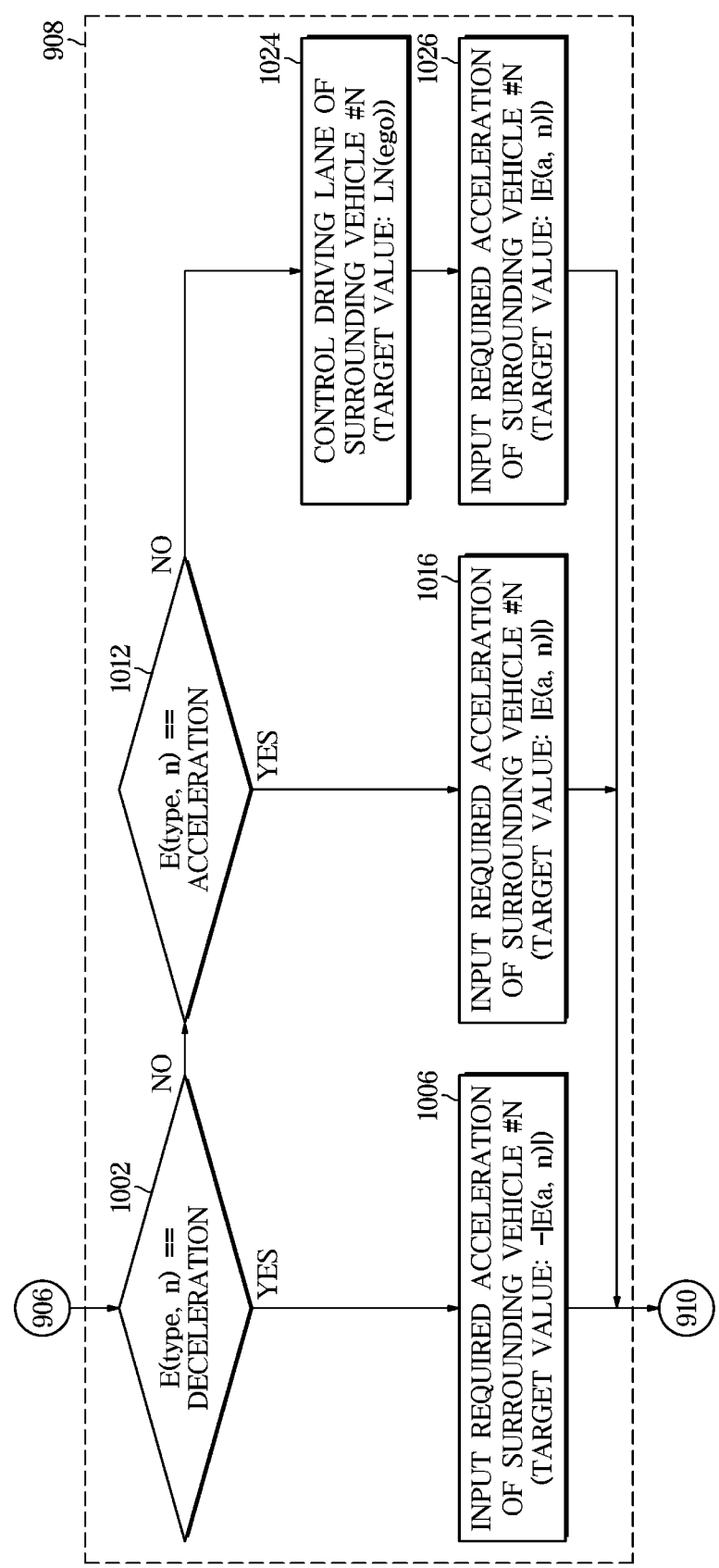
FIG. 10 is view showing an event execution in the event driving execution of FIG. 9.

FIG. 10 is a view showing an event execution in the event driving execution of FIG. 9. As shown in FIG. 10, if the event given to the surrounding vehicle #n is the deceleration (YES in 1002), a target value of a required acceleration of the surrounding vehicle #n is input as −|E(a, n)| (1006). E(a, n) is the event required acceleration setting value of the surrounding vehicle #n, and the deceleration is achieved by reversing the sign of the absolute value of E(a, n). If the event given to the surrounding vehicle #n is the acceleration (YES in 1012), the target value of the required acceleration of the surrounding vehicle #n may be input as |E(a, n)| (1016). E(a, n) is the event required acceleration setting value of the surrounding vehicle #n, and the acceleration may be achieved by inputting the absolute value |E(a, n)| of the E(a, n).

If the event given to the surrounding vehicle #n is a driving lane control rather than the acceleration or the deceleration (No in 1004), the driving lane control of the surrounding vehicle #n is performed (1024). A target value of the driving lane control may be to change a lane to travel along the same lane as the driving lane of the autonomous vehicle 200 LN(ego). At the same time, the target value of the required acceleration of the surrounding vehicle #n is input as E(a, n) (1026). E(a, n) is the event required acceleration setting value of the surrounding vehicle #n, and by inputting the target value of the required acceleration E(a, n), the acceleration may be performed if necessary during a lane change process. When the driving lane of the surrounding vehicle #n is adjusted, a lane change trajectory is generated based on the lane change time setting range of the surrounding vehicle #n E(LC, n) and the lane change may be performed.

As is apparent from the above, the embodiments of the present disclosure may be shortened the time required for the simulation, be continuously performed more events in a short time, and be performed the simulation in consideration of the road environment by implementing surrounding environments required for simulation using the plurality of surrounding vehicles, enabling to performing continuous events by the plurality of surrounding vehicles, and determining whether the event is performed in consideration of road conditions, etc.

The above description of the present disclosure is for illustrative purposes, and a person having ordinary skilled in the art should appreciate that other specific modifications may be easily made without departing from the technical spirit or essential features of the present disclosure. Therefore, the above exemplary embodiments should be regarded as illustrative rather than limitative in all aspects. The scope of the disclosure is not to be limited by the detailed description set forth above, but by the accompanying claims of the present disclosure, and it should also be understood that all changes or modifications derived from the definitions and scope of the claims and their equivalents fall within the scope of the present disclosure.

What is claimed is:

1. A method for simulation of an autonomous vehicle, comprising:
   preparing, by a controller, a setting of a parameter and an initial value configured to determine a driving condition of the autonomous vehicle and a driving condition of an event to be performed by a surrounding vehicle to implement a simulation environment to simulate the autonomous vehicle;
   performing, by the controller in the simulation environment, a normal driving in which the surrounding vehicle travels at a speed and a position that match a predetermined condition set in the parameter to perform the event given; and
   performing, by the controller in the simulation environment, an event driving in which the surrounding vehicle performs the event given based on a setting value of the parameter,
   wherein when a plurality of surrounding vehicles are present, the plurality of surrounding vehicles performs events in a predetermined order, and
   wherein the order of preforming the given event of the plurality of surrounding vehicles is determined according to a type and a degree of risk of the given event of each of the plurality of surrounding vehicles.

2. The method of claim 1, wherein the preparing of the setting of the parameter further includes calculating a distance related to the event of the surrounding vehicle based on precise map data, and calculating the number of surrounding vehicles based on user input data.

3. The method of claim 1, wherein the setting of the parameter and the initial value includes:
   setting, by the controller, a starting driving lane of the autonomous vehicle;
   setting, by the controller, a starting relative position between the autonomous vehicle and the surrounding vehicle; and
   setting, by the controller, a condition for the event to be performed by the surrounding vehicle.

4. The method of claim 3, wherein the setting of the condition for the event to be performed by the surrounding vehicle comprises at least one of:
   a safe distance between the autonomous vehicle and the surrounding vehicle;
   a relative speed of the surrounding vehicle relative to the autonomous vehicle;
   a type of the event;
   a degree of risk of the event;
   an acceleration of the surrounding vehicle when the event is performed; and
   a lane change time of the surrounding vehicle when the event is performed.

5. The method of claim 1, wherein the normal driving includes a follow mode in which the surrounding vehicle travels along the autonomous vehicle.

6. The method of claim 5, wherein the surrounding vehicle performing the follow mode is in a waiting state while following the autonomous vehicle before performing the event given.

7. The method of claim 1, further comprising generating a plurality of events in response to a plurality of different degrees of risk by changing the degree of risk to a plurality of different values.

8. An apparatus for simulation of an autonomous vehicle, comprising:
   a communicator configured to communicate with a simulation apparatus, the autonomous vehicle, and a surrounding vehicle; and
   a controller configured to:
      prepare a setting of a parameter and an initial value configured to determine a driving condition of the autonomous vehicle and a driving condition of an event to be performed by a surrounding vehicle to implement a simulation environment to simulate the autonomous vehicle,
      perform a normal driving in the simulation environment in which the surrounding vehicle travels at a speed and a position that match a predetermined condition set in the parameter to perform the event given, and
      perform an event driving in the simulation environment in which the surrounding vehicle performs the event given based on a setting value of the parameter,
      wherein when a plurality of surrounding vehicles are present, the plurality of surrounding vehicles performs events in a predetermined order, and
      wherein the order of preforming the given event of the plurality of surrounding vehicles is determined according to a type and a degree of risk of the given event of each of the plurality of surrounding vehicles.

9. The apparatus of claim 8, wherein the controller is configured to calculate a distance related to the event of the surrounding vehicle based on precise map data, and calculate the number of surrounding vehicles based on user input data when preparing the setting.

10. The apparatus of claim 8, wherein the setting of the parameter and the initial value includes:
    setting, by the controller, a starting driving lane of the autonomous vehicle;
    setting, by the controller, a starting relative position between the autonomous vehicle and the surrounding vehicle; and
    setting, by the controller, a condition for the event to be performed by the surrounding vehicle.

11. The apparatus of claim 10, wherein the setting of the condition for the event to be performed by the surrounding vehicle comprises at least one of:
    a safe distance between the autonomous vehicle and the surrounding vehicle;

a relative speed of the surrounding vehicle relative to the autonomous vehicle;

a type of the event;

a degree of risk of the event;

an acceleration of the surrounding vehicle when the event is performed; and a lane change time of the surrounding vehicle when the event is performed.

12. The apparatus of claim 8, wherein the normal driving includes a follow mode in which the surrounding vehicle travels along the autonomous vehicle.

13. The apparatus of claim 12, wherein the surrounding vehicle performing the follow mode is in a waiting state while following the autonomous vehicle before performing the event given.

14. The apparatus of claim 8, wherein the controller is further configured to generate a plurality of events in response to a plurality of different degrees of risk by changing the degree of risk to a plurality of different values.

15. A method for simulation of an autonomous vehicle, comprising:

preparing, by a controller, a setting of a parameter and an initial value configured to determine a driving condition of the autonomous vehicle and a driving condition of an event to be performed by a surrounding vehicle to implement a simulation environment to simulate the autonomous vehicle;

performing, by the controller in the simulation environment, a normal driving in which the surrounding vehicle travels at a speed and a position that match a predetermined condition set in the parameter to perform the event given; and performing, by the controller in the simulation environment, an event driving in which the surrounding vehicle performs the event given based on a setting value of the parameter; wherein when a plurality of surrounding vehicles are present, an order of preforming the given event in the plurality of surrounding vehicles is determined by a type and a degree of risk of the given event, and a plurality of events corresponding to a plurality of different degrees of risk is generated by changing the degree of risk to a plurality of different values.

16. An apparatus for simulation of an autonomous vehicle, comprising:

a communicator configured to communicate with a simulation apparatus, the autonomous vehicle, and a surrounding vehicle; and a controller configured to:

prepare a setting of a parameter and an initial value configured to determine a driving condition of the autonomous vehicle and a driving condition of an event to be performed by a surrounding vehicle to implement a simulation environment of to simulate the autonomous vehicle, perform a normal driving in the simulation environment in which the surrounding vehicle travels at a speed and a position that match a predetermined condition set in the parameter to perform the event given, and perform an event driving in the simulation environment in which the surrounding vehicle performs the event given based on a setting value of the parameter, wherein when a plurality of surrounding vehicles are present, an order of preforming the given event in the plurality of surrounding vehicles is determined by a type and a degree of risk of the given event, and a plurality of events corresponding to a plurality of different degrees of risk is generated by changing the degree of risk to a plurality of different values.

* * * * *